(12) United States Patent
Lee et al.

(10) Patent No.: US 8,106,512 B2
(45) Date of Patent: Jan. 31, 2012

(54) LOW RESISTANCE HIGH RELIABILITY CONTACT VIA AND METAL LINE STRUCTURE FOR SEMICONDUCTOR DEVICE

(75) Inventors: Hsiang-Huan Lee, Jhudong (TW); Ming Han Lee, Taipei (TW); Ming-Shih Yeh, Chupel (TW); Chen-Hua Yu, Hsin-Chu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/845,852

(22) Filed: Jul. 29, 2010

(65) Prior Publication Data

US 2011/0024908 A1 Feb. 3, 2011

Related U.S. Application Data

(63) Continuation-in-part of application No. 12/112,405, filed on Apr. 30, 2008, now Pat. No. 8,013,445.

(60) Provisional application No. 61/067,698, filed on Feb. 29, 2008.

(51) Int. Cl.
 *H01L 23/48* (2006.01)
 *H01L 23/52* (2006.01)
 *H01L 29/40* (2006.01)

(52) U.S. Cl. .................. 257/751; 257/E23.16

(58) Field of Classification Search .................. 257/751, 257/E23.16
See application file for complete search history.

(56) References Cited

U.S. PATENT DOCUMENTS

| 7,507,659 B2 | 3/2009 | Ohtsuka et al. |
| 2007/0048931 A1 | 3/2007 | Shimizu et al. |
| 2009/0218693 A1 | 9/2009 | Lee et al. |

*Primary Examiner* — William D Coleman
(74) *Attorney, Agent, or Firm* — Duane Morris LLP

(57) ABSTRACT

The structures and methods described above provide mechanisms to improve interconnect reliability and resistivity. The interconnect reliability and resistivity are improved by using a composite barrier layer, which provides good step coverage, good copper diffusion barrier, and good adhesion with adjacent layers. The composite barrier layer includes an ALD barrier layer to provide good step coverage. The composite barrier layer also includes a barrier-adhesion-enhancing film, which contains at least an element or compound that contains Mn, Cr, V, Ti, or Nb to improve adhesion. The composite barrier layer may also include a Ta or Ti layer between the ALD barrier layer and the barrier-adhesion-enhancing layer.

20 Claims, 8 Drawing Sheets

LOW RESISTANCE HIGH RELIABILITY CONTACT VIA AND METAL LINE STRUCTURE FOR SEMICONDUCTOR DEVICE

RELATED APPLICATIONS

This application is related to and claims priority of U.S. patent application Ser. No. 12/112,405 entitled LOW RESISTANCE HIGH RELIABILITY CONTACT VIA AND METAL LINE STRUCTURE FOR SEMICONDUCTOR DEVICE, filed Apr. 30, 2008, which claims priority to U.S. Provisional Application Ser. No. 61/067,698 entitled LOW RESISTANCE HIGH RELIABILITY CONTACT VIA AND METAL LINE STRUCTURE FOR SEMICONDUCTOR DEVICE, filed Feb. 29, 2008. The contents of both above-mentioned applications are incorporated by reference in their entirety.

FIELD

The present application relates, most generally, to semiconductor devices and methods for forming the same. More particularly, the present application relates to a conductive structure formed in a semiconductor device.

BACKGROUND

In today's rapidly advancing semiconductor manufacturing industry, the integrated circuit chips that form semiconductor devices include a multitude of conductive structures such as interconnect lines, contacts and vias. The performance of a semiconductor device depends upon device speed and there is an aggressive, continuing push to increase device speed and reliability. The speed and reliability of a device are highly dependent upon the resistivity and proper formation of interconnect, which includes contacts, vias, and metal lines. As such, various materials and combinations of materials have been used in an attempt to provide low-resistance interconnect structures with good step coverage and interfacial adhesion properties. As technologies advance, device features become smaller and smaller and the aspect ratios of the openings within which contacts, vias and other conductive structures are formed, becomes higher. This makes it more difficult to completely fill the contact or via openings in a void-free manner necessary to produce a suitably low contact or via resistance, using conventional technology. The reliability of a semiconductor device is also extremely critical and reliability can be degraded or compromised by poor formation of interconnect structures.

It would therefore be desirable to produce conductive interconnect structures such as contacts, vias and conductive lines, with low resistance and high reliability and which are scalable to the reduced geometries and high aspect ratios required in today's semiconductor manufacturing industry. It is within this context the following disclosure arises.

BRIEF DESCRIPTION OF THE DRAWINGS

The present application is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

A conventional structure commonly used as a contact between a metal layer and a further semiconductor device or used as a via between metal layers, is a tungsten plug with one or more barrier layers and other layers. Conventional contact structures are commonly formed by forming an opening in a dielectric layer, then forming a PVD, physical vapor deposition, barrier layer with an additional glue layer lining the opening prior to filling the opening with CVD tungsten, i.e. tungsten formed using a chemical vapor deposition, CVD, process. Barrier layers are utilized extensively in semiconductor device processing. Barrier layers are used at contact junctions between metal materials to prevent spiking between the metal materials. As the aspect ratio of single or dual damascene contact and via structures increases, it becomes increasingly difficult to obtain good step coverage using conventional PVD and CVD methods. The poor step coverage results in voids that increase the resistivity of the contact structure and degrade device performance. Additionally, as the size of the contact continues to decrease, the resistivity of the tungsten contact increases dramatically, slowing down the semiconductor device and thereby degrading performance. As such, copper has been considered as a replacement for tungsten in contact and via structures. However, copper conventionally requires the initial formation of a PVD barrier layer followed by a seed layer formed in the opening before copper gapfill takes place. As above, the shortcomings of forming a barrier layer using PVD processes include poor step coverage and an associated increase in resistance and a decrease in reliability.

Aspects of the application include a semiconductor conductive structure. The conductive structure may be a contact, i.e. a conductive structure that provides contact between a metal line and a semiconductor structure, in some embodiments. In some other embodiments, the conductive structure may be a via, i.e. a conductive structure that provides contact between metal layers disposed at different topographical locations. In Yet some other embodiments, the conductive structure may be a metal lead line that travels laterally and which may contact other subjacent metal lines or semiconductor devices and/or superjacent metal lines. The following illustrated embodiments are intended to be exemplary only as the illustrated methods and structures of the application may be used in other applications. In other words, the structure of a conductive structure illustrated as a contact over a semiconductor material may also be used as a via over a metal material and vice versa.

Figure 1A:
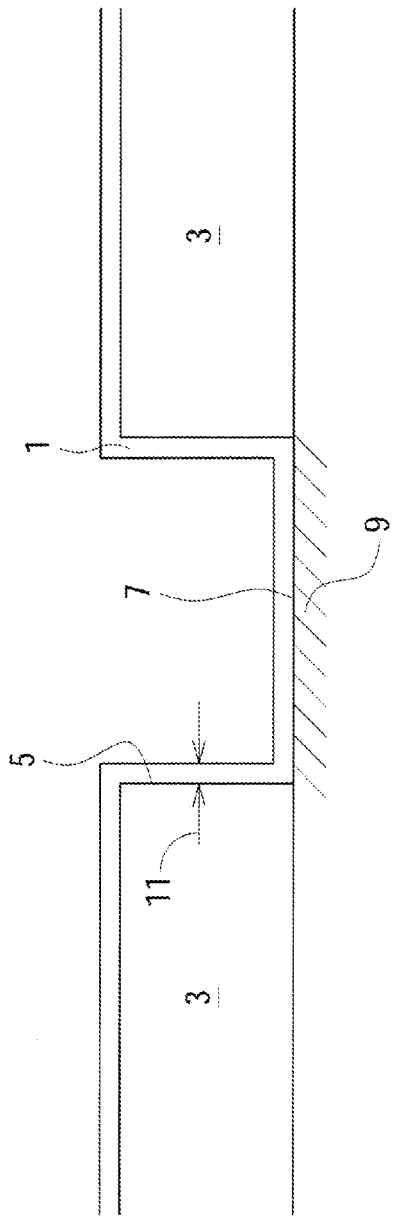
FIGS. 1A and 1B are cross-sectional views illustrating a sequence of processing operations used to produce the exemplary semiconductor structure shown in FIG. 1B, in accordance with some embodiments.

Now turning to the figures, FIG. 1A shows an ALD (atomic layer deposition) layer 1 formed within an opening in dielectric layer 3. The opening is defined by sidewalls 5 and a bottom 7. The opening extends through dielectric layer 3 and contacts subjacent material 9. In other exemplary embodiments, the bottom of the opening may lie within dielectric layer 3. Subjacent material 9 may be a semiconductor material implanted with one or more dopant impurities in some embodiments. However, subjacent material 9 may be any of various other materials or further structures such as a metal surface or a surface of another semiconductor structure, in some other embodiments. Dielectric layer 3 may be any of various suitable dielectric materials used in the semiconductor manufacturing industry. Dielectric layer 3 may be an oxide, an oxynitride, a low-k dielectric, a high-k dielectric, a doped dielectric (such as phosphorous-doped silicon glass "PSG", or boron-phosphorous-doped silicon glass "BPSG"), or other dielectric materials and dielectric layer 3 may advantageously be a dielectric chosen in conjunction with the conductive material that will be used to substantially fill the opening formed within dielectric layer 3. Dielectric layer 3 may represent a stack of dielectric films in various exemplary embodiments.

ALD layer 1, an interconnect barrier layer, is formed using atomic layer deposition (ALD), a gas phase chemical process used to create extremely thin and conformal films. Various ALD techniques may be used. ALD is a self-limiting sequential surface chemistry that deposits conformal thin film materials onto substrates of various compositions. ALD reactions typically use precursor materials and by keeping the precursor material separate throughout the deposition process, atomic scale deposition control is achievable. The conformal ALD film provides excellent step coverage regardless of the topography over which the ALD film is formed and, hence, regardless of the aspect ratio of the opening within which the ALD firm is formed. An interconnect barrier layer with good step coverage would keep the resistivity of interconnect low. The atomic scale deposition control results in ALD layer 1 being a conformal film formed to a thickness 11 that may range from about 2 angstroms (Å) to about 100 angstroms (Å) in some embodiments but other thicknesses may be achieved in other embodiments. The ALD layer 1 cannot be too thick to ensure that the aspect ratio of the opening is not significantly increased. The ratio of ALD layer 1 thickness 11 along sidewalls 5 to ALD layer 1 thickness 11 along bottom 7 may be from 0.6:1 to 1.8:1 in some embodiments. However, other ratios may be achieved in other embodiments. ALD layer 1 may be TaN in some embodiments, but other suitable Cu barrier materials such as TiN, WN, Co, CoN and the like may be used in other embodiments. ALD layer 1 may be amorphous or polycrystalline in nature and it may include suitable additives such as but not limited to, C, O or F.

Figure 1B:
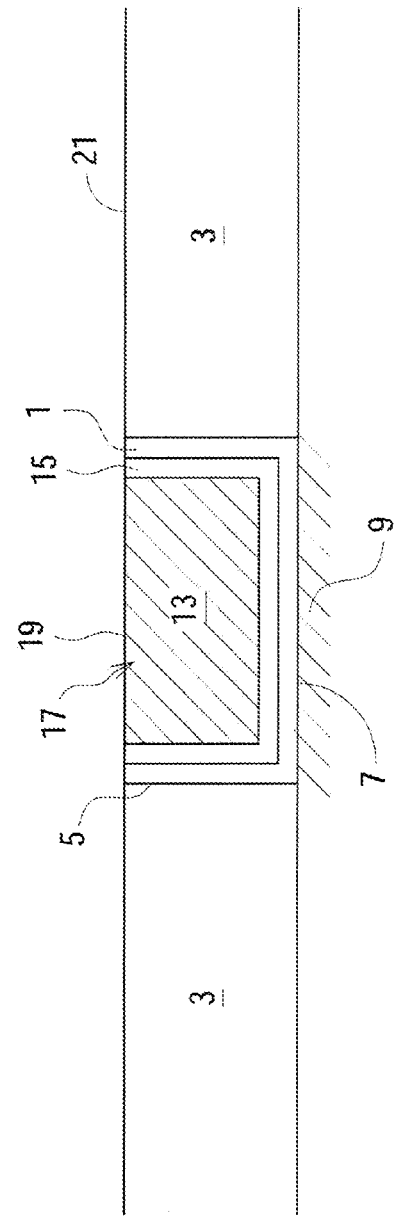

FIG. 1B shows the structure of FIG. 1A after a sequence of subsequent processing operations have been carried out upon the structure. Another barrier film 15 is formed on ALD layer 1 and within the opening formed in dielectric layer 3. Barrier film 15 may be a Mn-containing, or Mn-based layer such as formed of Mn, $MnO_x$, $MnC_x$, $MnSi_xO_y$, $MnN_x$ or various combinations thereof. In some exemplary embodiments, barrier film 15 may be a Cr-based layer, a V-based layer, a Nb-based layer, a Ti-based layer or suitable various combinations thereof. As with the Mn embodiment, the Cr, V, Nb, or Ti-based layer may be substantially an elemental film or it may be various suitable compounds. Elements, such as Man, Cr, V, Nb, or Ti, and their compounds act as copper diffusion barrier and enhance (or promote) adhesion between the ALD layer 1 and subsequent copper layer. In various exemplary embodiments, the Cr-based barrier layer may be at least one of $CrO_x$, $CrC_x$, $CrSi_xO_y$, and $CrN_x$; the V-based barrier layer may be at least one of $VO_x$, $VC_x$, $VSi_xO_y$, and $VN_x$; the Nb-based barrier layer may be at least one of $NbO_x$, $NbC_x$, $NbSi_xO_y$, and $NbN_x$; and the Ti-based barrier layer may be at least one of $Ti\ O_x$, $Ti\ C_x$, $TiSi_xO_y$, and $Ti\ N_x$, but in each case, other suitable compounds may be used in other exemplary embodiments. Conventional methods such as PVD, physical vapor deposition, or CVD, chemical vapor deposition, may be used to form barrier film 15. Barrier film 15 improved adhesion between ALD layer 1 and a subsequently formed conductive material and thus improves electromigration performance.

In some embodiments, barrier film 15 is a copper alloy, which contains one or more barrier-adhesion-enhancing elements of compounds, selected from Mn, Mn-containing compounds, Cr, Cr-containing compounds, V, V-containing compounds, Nb, Nb-containing compounds, Ti, and Ti-containing compounds. Barrier film 15 may also be called a barrier-adhesion-enhancing film (or layer). In some embodiments, the concentration of the one or more barrier-adhesion-enhancing elements or compounds is between about 0.5% to about 2%. In some other embodiments, the concentration of the one or more barrier-adhesion-enhancing element of compounds is between about 0.1% to about 5%. The thickness of the barrier film 15 measured on the top of the substrate surface is between about 200 Å to about 800 Å, in accordance with some embodiments. Due to shadowing effect, the thickness of barrier film 15 is lower than the thickness on substrate surface. In some embodiments, the copper alloy with the barrier-adhesion-enhancing element(s) and/or compounds mentioned above is deposited over the ALD layer 1 by PVD. The copper in the barrier film 15 (a copper alloy) may also act as copper seed for subsequent copper plating.

After the formation of barrier film 15, the opening is preferably filled with copper 13 and the structure may then be planarized or polished using chemical mechanical polishing, CMP, or other polishing operations to form conductive structure 17 having a surface 19 being coplanar with top surface 21 of dielectric layer 3. Copper 13 may be formed using ECP, electrochemical plating, or other suitable deposition techniques. A metal or other film may be formed over conductive structure 17 although not illustrated in FIG. 1B and in this manner, conductive structure 17 provides electrical contact between a conductive or semiconductive material formed thereover and a conductive or semiconductive material formed thereunder, i.e. subjacent material 9.

In some embodiments, the structure of FIG. 1B is subjected to thermal anneal, which can occur immediately after the deposition of copper layer 13, after the formation of the structure or after additional substrate processing operations. The additional substrate processing operations may include deposition, patterning, etching, and other processing operations to form additional layers. In some embodiments, the thermal anneal is performed at a temperature in a range between about 250° C. to about 400° C. In some embodiments, the annealing is performed in an environment filled with a forming gas, which includes a gas mixture of $N_2$ and $H_2$ (3-5%). $N_2$ is an inert gas for metal(s), used in interconnect, and the $H_2$ in the forming gas protects metallic film(s) from oxidization. In some embodiments, only $N_2$ gas is used during annealing. Other types of inert gases, such as He and Ar, can also be used for thermal annealing. In some embodiments, the annealing gas mixture includes a small amount of $H_2$, such as between about 2% to about 10% $H_2$. The barrier-adhesion-enhancing element(s) and/or compound(s) in barrier film 15 (a copper alloy) may migrate to the interface between barrier film 15 and ALD layer 1 during annealing. For example, if Mn is the barrier-adhesion-enhancing element, Mn would migrate to the surface of ALD layer 1. Further, Mn may react with oxygen and/or silicon in the vicinity to form $MnO_x$ and/or $MnSi_xO_y$, which bond very well with ALD layer 1. The oxygen and silicon could be from the ALD layer 1 and/or the dielectric layer 3. The thermal annealing operation could be more than one. Thermal annealing of the structure/films occurs when the substrate is placed in an environment under the annealing temperature with the annealing gas.

Figure 1C:
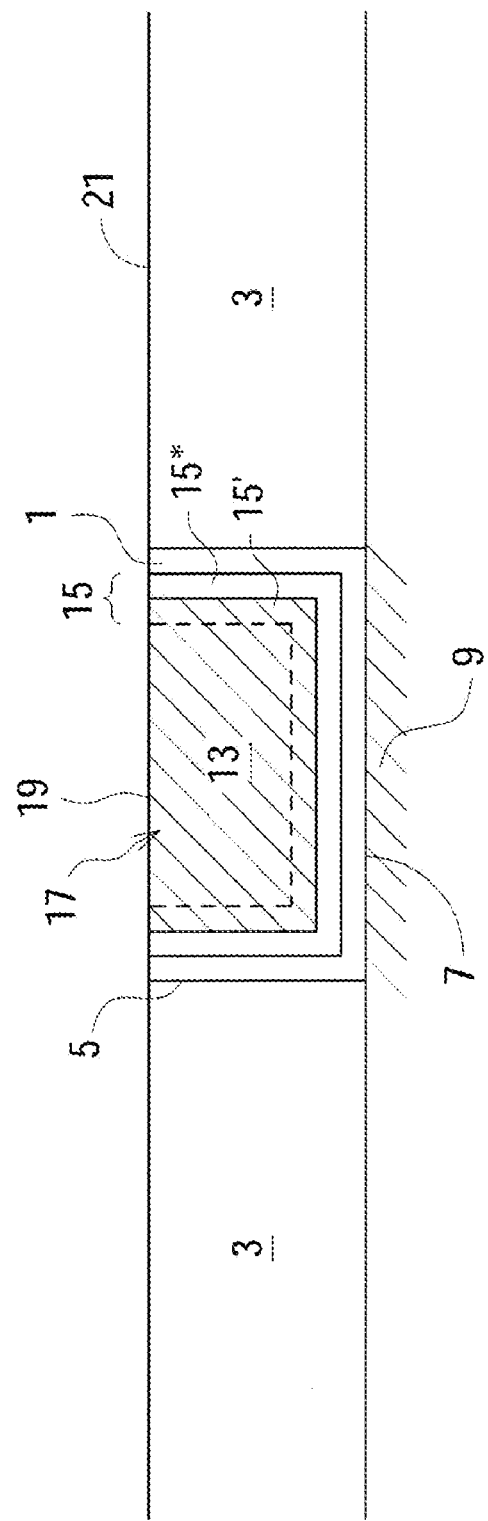
FIG. 1C is a cross-sectional view showing another exemplary structure, in accordance with some embodiments.

FIG. 1C shows the barrier film 15 is separated into a sub-layer 15\* with high concentration of the barrier-adhesion-enhancing element(s)/compound(s) and a sub-layer 15' made mostly of copper after thermal annealing. Sub-layer 15' is almost indistinguishable with the conductive copper layer 13. In some embodiments, the thickness of the sub-layer 15\* is between about 20 Å to about 50 Å. The thermal annealing operation(s) improves reliability performance of the structures due to adhesion-improving capability of the Mn-containing film between the ALD layer 1 and copper layer 13. In some embodiments, the duration of the thermal anneal is between about 10 minutes to about 2 hours. As mentioned above, the annealing treatment can be performed right after the deposition of copper layer 13, after CMP of layer 13, or after other process operations. Studies show that the thicker the barrier film 15 is or the higher concentration of the barrier-adhesion-enhancing element(s) and/or compound(s) is in film 15, the longer the thermal annealing period is required to allow the element(s) and/or compound(s) time to diffuse to the interface.

Figure 1D:
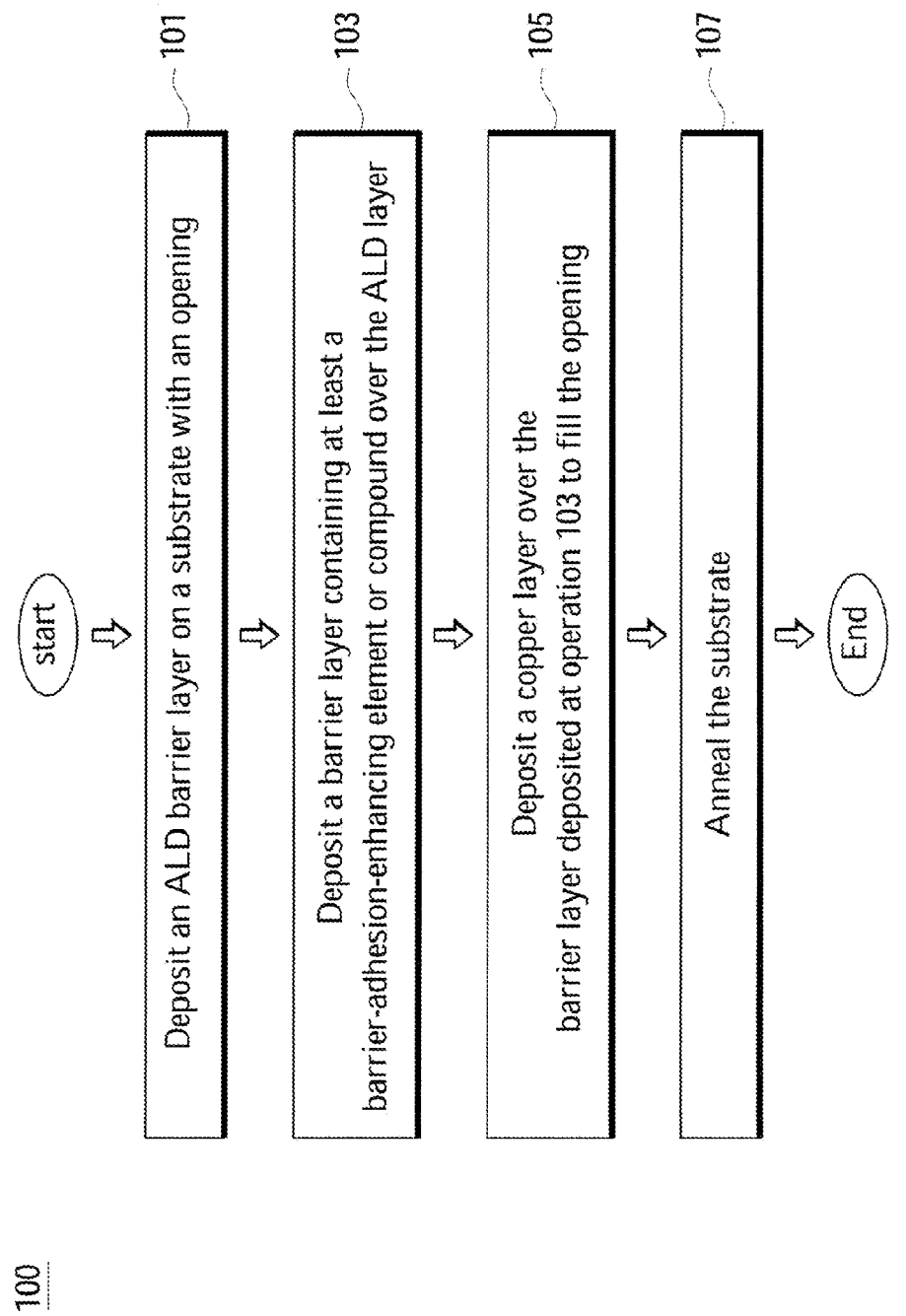
FIG. 1D is a process flow of making the structure shown in FIG. 1C, in accordance with some embodiments.

FIG. 1D shows a process of flow 100 of preparing a structure shown in FIG. 1C, in accordance with some embodiments. At operation 101, an ALD barrier layer is deposited on a substrate with an opening. The ALD barrier layer is the ALD layer 1 described above. At operation 103, a barrier layer containing at least a barrier-adhesion-enhancing element or compound is deposited over the ALD barrier layer. The barrier layer at operation 103 is the barrier film 15 described above. At operation 105, a copper layer is deposited over the barrier layer deposited at operation 103 to fill the opening. At operation 107, the substrate is thermally annealed after copper layer is deposited. The annealing conditions described above can be used. Between operation 105 and 107 there could be no substrate processing operation (annealing immediately after), or there could be additional processing operations, such as CMP, ILD deposition, patterning, etching, etc.

The presence of oxygen in the ALD layer 1 has adverse effects on adhesion and electro-migration. Copper is known not to adhere well to oxidized ALD layer 1. In some embodiments, the deposition of the ALD layer and the deposition of barrier film 15 are performed in an integrated system without exposing the substrate after ALD layer 1 deposition to ambient. The substrate in the integrated system is transferred from one processing module to another processing module under vacuum to limit (or minimized) exposure to oxygen, in accordance with some embodiments.

Figure 2:
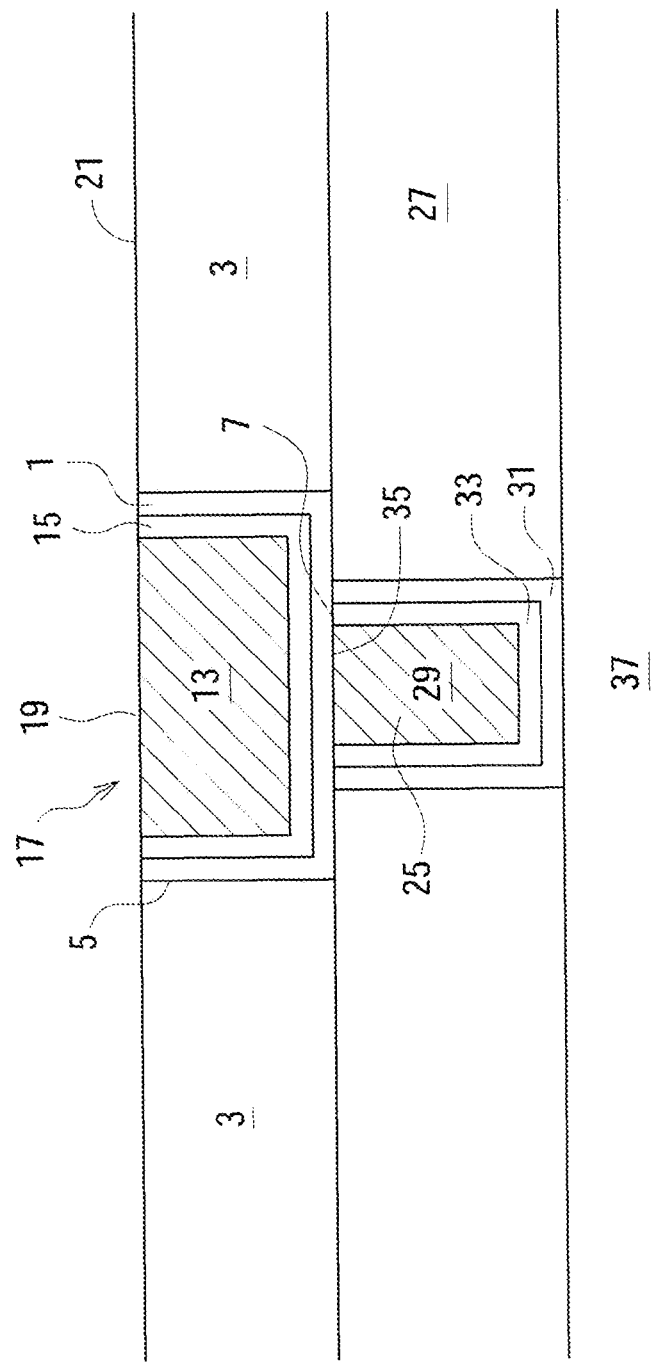
FIG. 2 is a cross-sectional view showing another exemplary structure, in accordance with some embodiments.

FIG. 2 is a cross-sectional view showing conductive structure 17, described in conjunction with FIG. 1B, disposed over conductive structure 25. Conductive structure 25 is formed within dielectric layer 27 and over substrate 37 and includes films 31 and 33 and conductive material 29. Dielectric layer 27 may represent a stack of dielectric films and may be an oxide, an oxynitride, a low-k dielectric, doped dielectric, a high-k dielectric or other dielectric materials. According to one exemplary embodiment, conductive structure 25 may be substantially similar to conductive structure 17, i.e. film 31 may be an ALD layer, film 33 may be a barrier layer such as an Mn-based layer, conductive material 29 may be copper and substrate 37 may be subjacent material 9 such as described in conjunction with FIG. 1B. According to this illustrated embodiment, bottom 7 of conductive structure 17 contacts metal surface 35 of conductive structure 25.

Figure 3:
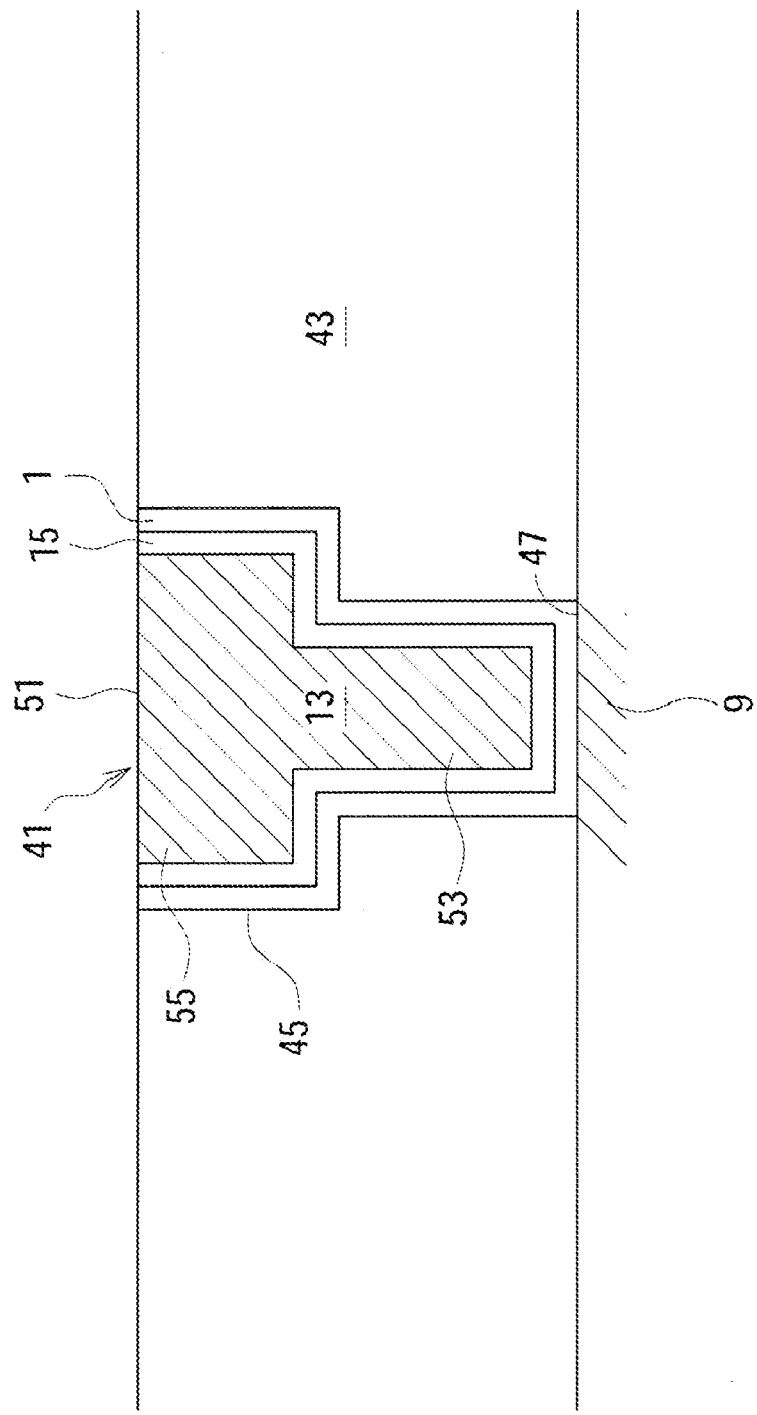
FIG. 3 is a cross-sectional view of yet another exemplary structure, in accordance with some embodiments.

FIG. 3 shows a conductive structure formed in a dual damascene opening according to another aspect of the application. Conductive structure 41 is formed within a dual damascene opening defined by sidewalls 45 and bottom 47, the opening extending through dielectric layer 43. Dielectric layer 43 may be formed of any of various suitable dielectric materials and the dual damascene opening may be formed using various conventional techniques and an etch-stop layer (not illustrated) may optionally be included at the juncture between the upper and lower portions of the dual damascene opening. Conformal ALD layer 1, barrier film 15 and copper 13 are as described previously and planarized surface 51 may be formed using various polishing and planarizing techniques.

Still referring to FIG. 3, copper 13 may include a lower portion 53 that serves as a contact structure in a contact portion of the dual damascene opening, and an upper portion 55 that may be a first metal (MI) interconnect lead formed in the upper trench portion of the dual damascene opening. A barrier free structure is then produced between the copper contact structure, and the copper first metal interconnect structure. The structure in FIG. 3 may also be a dual damascene structure for upper-level interconnect, such as Via with M2, M3, M4, or higher levels of metal.

Figure 4:
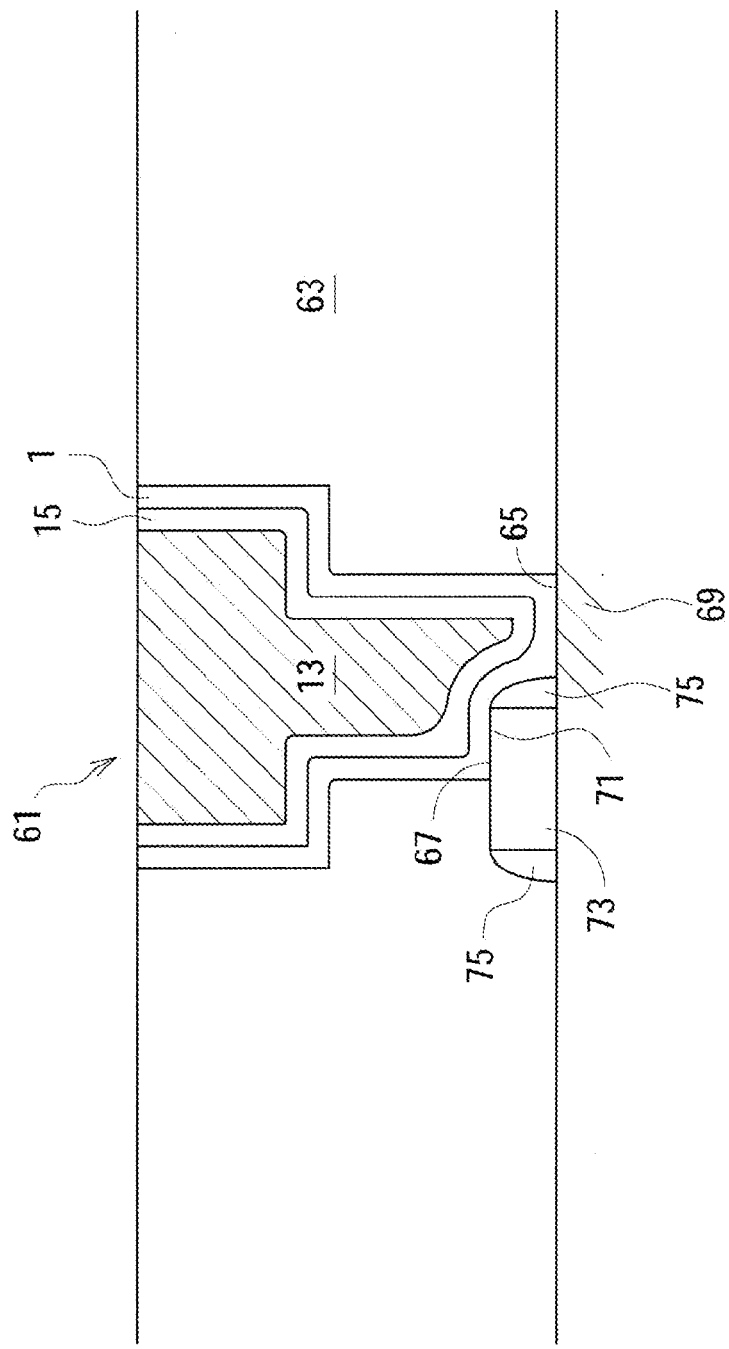
FIG. 4 is a cross-sectional view showing still another exemplary structure, in accordance with some embodiments.

FIG. 4 shows conductive structure 61 formed in a generally dual damascene opening formed in dielectric layer 63. Similar to dielectric layer 43, dielectric layer 63 may be formed of any of various suitable dielectric materials and the dual damascene opening may be formed using various conventional techniques and an etch-stop layer (not illustrated) may optionally be included at the juncture between the upper and lower portions of the dual damascene opening. The bottom of conductive structure 61 includes lower bottom portion 65 and raised bottom portion 67. Lower bottom portion 65 contacts subjacent material 69 which may be a semiconductor material that includes dopant impurities therein, such as introduced using ion implantation or other suitable diffusion techniques. Material 69 may be a silicide, which contains a metallic element, such as Ni, Co, or other suitable element. Raised bottom portion 67 contacts top surface 71 of gate structure 73. In some embodiments, gate structure 73 may be a polycide gate of a transistor and the polycide gate may include optional spacers 75. In some other embodiments, gate structure 73 may be made of various other structures, such as replacement gate structures (or gate last structures).

Figure 5:
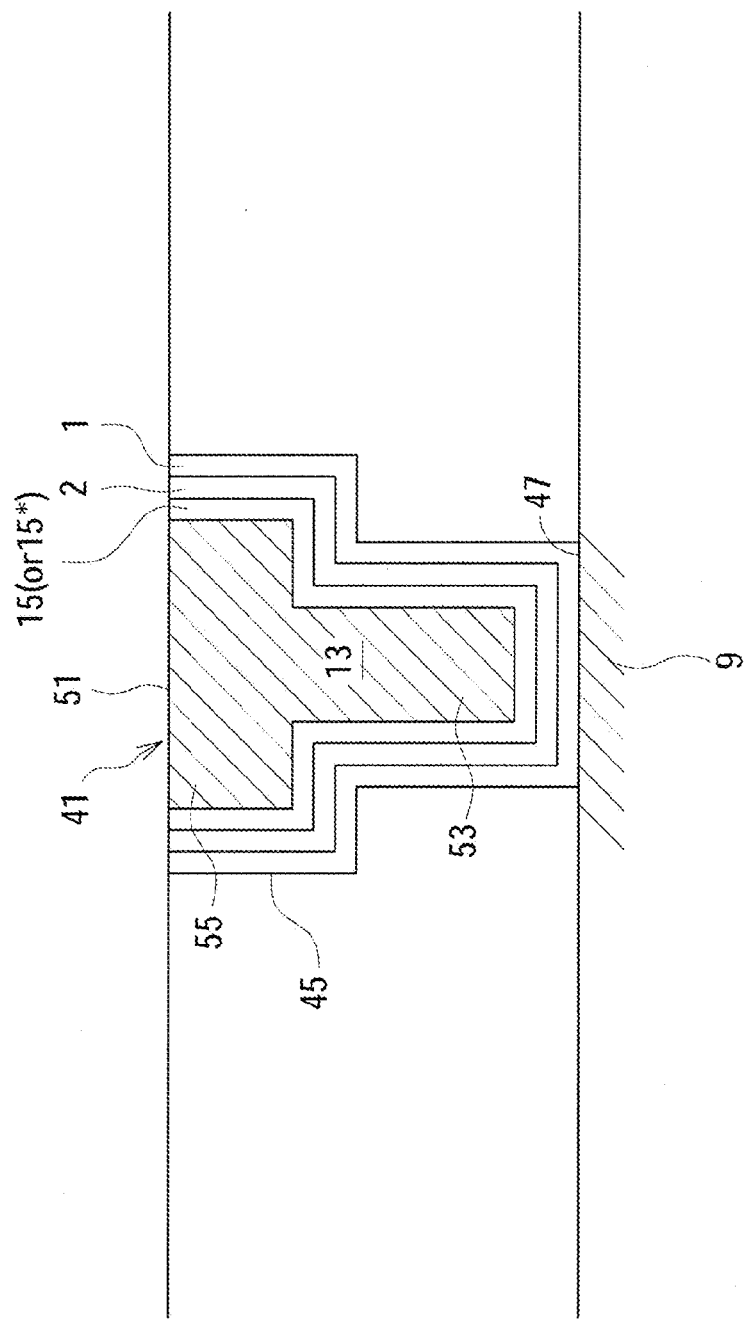
FIG. 5 is a cross-sectional view showing another exemplary structure, in accordance with some embodiments.

The various embodiments described above in conjunction with FIGS. 1B, 2, 3, and 4 show interconnect structures with dual barrier/adhesion layers, which include layer 1 and layer 15 (or layer 15\*). In some embodiments, an additional barrier/adhesion layer 2 is inserted between layer 1 and layer 15, as shown in FIG. 5. FIG. 5 is similar to FIG. 3, with the exception of FIG. 5 having an additional layer 2. Layer 2 is made of a conductive metal, such as Ta or Ti, which adheres well with ALD layer 1 and barrier film 15. In addition to enhancing (or promoting) adhesion, layer 2 may also be a diffusion barrier for copper. Conventional methods, such as PVD or CVD, may be used to form barrier layer 2. The thickness of layer 2 is between about 20 Å to about 100 Å, in accordance with some embodiments. Devices with interconnect having the ALD layer 1, barrier layer 2, and barrier film 15 also show good reliability results and low resistivities. As mentioned above, barrier film 15 can become barrier film 15* after annealing. The structure in FIG. 5 is merely used as an example. The insertion of an additional layer 2 may also be used for other interconnect structures, such as structures shown in FIGS. 1B, 1C, 2, and 4.

Figure 6:
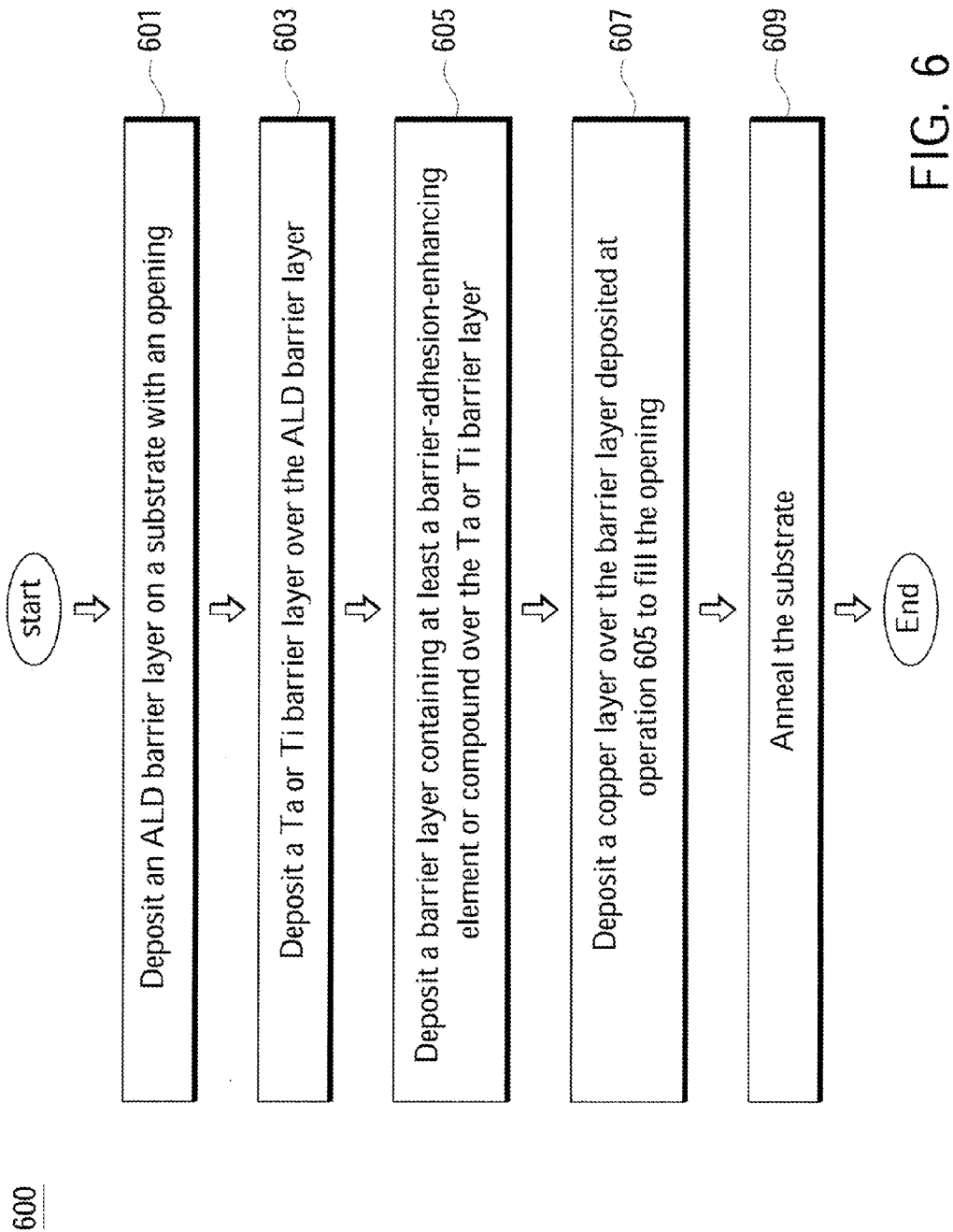
FIG. 6 is a process flow of making the structure shown in FIG. 5, in accordance with some embodiments.

FIG. 6 shows a process of flow 600 of preparing a structure shown in FIG. 5, in accordance with some embodiments. At operation 601, an ALD barrier layer is deposited on a substrate with an opening. The ALD barrier layer is the ALD layer 1 described above and is a barrier layer. At operation 603, a Ta or Ti barrier layer is deposited over the ALD barrier layer. The Ta or Ti barrier layer is described as layer 2 above. At operation 605, a barrier layer with at least one barrier-adhesion-enhancing element or compound is deposited over the Ta or Ti barrier layer. The barrier layer with at least one barrier-adhesion-enhancing element or compound is the barrier film 15 described above. In some embodiments, the barrier layer deposited in operation 605 is a copper alloy with the at least a barrier-adhesion-enhancing element or compound. At operation 607, a copper layer is deposited over the barrier layer deposited at operation 605 to fill the opening. At operation 609, the substrate is thermally annealed after the copper layer is deposited. The annealing conditions described above can be used. Between operation 607 and 609 there could be no processing, or additional processing operations, such as CMP, ILD deposition, patterning, etching, etc.

While the described exemplary conductive structures may advantageously be contact or via structures, according to various exemplary embodiments, the cross-sectional representations of the conductive structures may represent a latitudinal or other cross-section of a metal interconnect lead line.

The structures and methods described above provide mechanisms to improve interconnect reliability and resistivity. The interconnect reliability and resistivity are improved by using a composite barrier layer, which provides good step coverage, good copper diffusion barrier, and good adhesion with adjacent layers. The composite barrier layer includes an ALD barrier layer to provide good step coverage. The composite barrier layer also includes a barrier-adhesion-enhancing film, which contains at least an element or compound that contains Mn, Cr, V, Ti, or Nb to improve adhesion. The composite barrier layer may also include a Ta or Ti layer between the ALD barrier layer and the barrier-adhesion-enhancing layer.

A semiconductor device is provided. The semiconductor device includes a conductive structure disposed within a dielectric. The conductive structure includes a composite barrier layer lining an opening formed in said dielectric. The composite barrier layer includes an atomic-layer-deposition (ALD) layer along sidewalls and a bottom of said opening, a Ta or Ti layer covering the ALD layer, and an Mn-based layer over said Ta or Ti layer. The conductive structure also includes a Cu film substantially filling said opening and bounding said Mn-based layer.

A semiconductor device is provided. The semiconductor device includes a conductive structure disposed within a dielectric. The conductive structure includes a composite barrier layer lining an opening formed in the dielectric. The composite barrier layer includes an atomic-layer-deposition (ALD) layer along sidewalls and a bottom of the opening, a Ta or Ti layer covering said ALD layer, and a barrier layer with at least one barrier-adhesion-enhancing element of compound over the Ta or Ti layer. The conductive structure also includes a Cu film substantially filling said opening and bounding said barrier layer with at least one barrier-adhesion-enhancing element or compound.

A method for forming a semiconductor device is provided. The method includes using an atomic layer deposition (ALD) method to deposit an ALD TaN layer along sidewalls and covering a bottom surface of an opening extending through a dielectric layer. The method also includes forming a Ta or Ti layer, and forming an Mn-based barrier layer on the Ta or Ti layer. The method further includes depositing a Cu film in said opening such that the Cu film contacts the Mn-based barrier layer and substantially fills the opening, thereby forming a conductive structure in the opening.

The preceding merely illustrates the principles of the application. It will thus be appreciated that those skilled in the art will be able to devise various arrangements which, although not explicitly described or shown herein, embody the principles of the application and are included within its spirit and scope.

For example, the various different conductive structures that represent the exemplary illustrated embodiments of the application such as contact and vias formed in damascene or dual damascene openings may be used interchangeably. Moreover, the variously configured conductive structures may provide contact between various superjacent features and various subjacent features.

Furthermore, all examples and conditional language recited herein are principally intended expressly to be only for pedagogical purposes and to aid the reader in understanding the principles of the application and the concepts contributed by the inventors to furthering the art, and are to be construed as being without limitation to such specifically recited examples and conditions. Moreover, all statements herein reciting principles, aspects, and embodiments of the application, as well as specific examples thereof, are intended to encompass both structural and functional equivalents thereof. Additionally, it is intended that such equivalents include both currently known equivalents and equivalents developed in the future, i.e. any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although various exemplary embodiments have been described, it is not limited thereto. Rather, the embodiments includes other variants and embodiments which may be made by those skilled in the art without departing from the scope and range of equivalents of the embodiments.

What is claimed is:
1. A semiconductor device comprising:
a conductive structure disposed within a dielectric, said conductive structure comprising:
a composite barrier layer lining an opening formed in said dielectric, said composite barrier layer including an atomic-layer-deposition (ALD) layer along sidewalls and a bottom of said opening, a Ta or Ti layer covering said ALD layer, and an Mn-based layer over said Ta or Ti layer; and a Cu film substantially filling said opening and bounding said Mn-based layer.

2. The semiconductor device as in claim 1, wherein said ALD layer is selected from a group consisting of TaN, TiN, WN, Co, and CoN.

3. The semiconductor device as in claim 1, wherein said opening comprises a damascene opening and said bottom surface comprises a metal surface.

4. The semiconductor device as in claim 1, wherein said bottom comprises a first portion comprising a subjacent layer of semiconductor material with dopant impurities therein.

5. The semiconductor device as in claim 1, wherein said Mn-based layer comprises at least one of $MnO_x$, $MnC_x$, $MnN_x$ and $MnSi_xO_y$, and said bottom of said opening is a metal surface.

6. The semiconductor device as in claim 1, wherein said opening is a dual damascene opening and said bottom includes a lower bottom portion comprising a subjacent layer of semiconductor material with dopant impurities therein, and a raised bottom portion comprising a gate structure formed over said subjacent layer.

7. The semiconductor device as in claim 1, wherein said ALD layer has a thickness in a range between about 2 Å to about 100 Å.

8. The semiconductor device in claim 1, wherein said Ta or Ti layer has a thickness in a range between about 20 Å to about 100 Å.

9. The semiconductor device in claim 1, wherein said Mn-based layer has a thickness in a range between about 20 Å to about 50 Å.

10. The semiconductor device as in claim 4, wherein said bottom comprises a second portion comprising another subjacent layer being part of a gate structure.

11. A semiconductor device comprising:
a conductive structure disposed within a dielectric, said conductive structure comprising:
a composite barrier layer lining an opening formed in said dielectric, said composite barrier layer including an atomic-layer-deposition (ALD) layer along sidewalls and a bottom of said opening, a Ta or Ti layer covering said ALD layer, and a barrier layer with at least one barrier-adhesion-enhancing element of compound over said Ta or Ti layer,
a Cu film substantially filling said opening and bounding said barrier layer with at least one barrier-adhesion-enhancing element or compound.

12. The semiconductor device in claim 11, wherein said ALD layer is selected from a group consisting of TaN, TiN, WN, Co, and CoN.

13. The semiconductor device in claim 11, wherein said barrier layer with at least one barrier-adhesion-enhancing element or compound contains Mn, Cr, V, Nb, or Ti.

14. The semiconductor device as in claim 11, wherein said opening is a dual damascene opening and said bottom includes a lower bottom portion comprising a subjacent layer of semiconductor material with dopant impurities therein, and a raised bottom portion comprising a gate structure formed over said subjacent layer.

15. The semiconductor device as in claim 11, said bottom comprises a portion comprising a subjacent layer of semiconductor material with dopant impurities therein or a metal surface.

16. A method for forming a semiconductor device, said method comprising:
using an atomic layer deposition (ALD) method to deposit an ALD TaN layer along sidewalls and covering a bottom surface of an opening extending through a dielectric layer;
forming a Ta or Ti layer;
forming an Mn-based barrier layer on said Ta or Ti layer; and
depositing a Cu film in said opening such that said Cu film contacts said Mn-based barrier layer and substantially fills said opening, thereby forming a conductive structure in said opening.

17. The method as in claim 16, further comprising:
performing a thermal anneal after the Cu film is deposited in said opening.

18. The method as in claim 16, wherein the Mn-barrier layer contains copper.

19. The method as in claim 17, wherein the thermal anneal is performed in an environment filled with forming gas.

20. The method as in claim 18, wherein the concentration of Mn in the Mn-barrier layer is in a range between about 0.5% to about 2%.

* * * * *

UNITED STATES PATENT AND TRADEMARK OFFICE
CERTIFICATE OF CORRECTION

| | | |
|---|---|---|
| PATENT NO. | : 8,106,512 B2 | |
| APPLICATION NO. | : 12/845852 | |
| DATED | : January 31, 2012 | |
| INVENTOR(S) | : Hsiang-Huan Lee et al. | |

It is certified that error appears in the above-identified patent and that said Letters Patent is hereby corrected as shown below:

Column 9, line 32, delete:

"bottom comprises a second portion comprising another sub-"

Column 9, line 32, replace with:

"bottom further comprises a second portion comprising another sub-"

Signed and Sealed this
Sixteenth Day of October, 2012

David J. Kappos
*Director of the United States Patent and Trademark Office*